US012772880B2

(12) United States Patent
Duong et al.

(10) Patent No.: US 12,772,880 B2
(45) Date of Patent: Oct. 20, 2026

(54) AIR GAP ARCHITECTURE FOR HIGH SPEED I/O SUBSTRATE TRACES

(71) Applicant: Intel Corporation, Santa Clara, CA (US)

(72) Inventors: Benjamin Duong, Phoenix, AZ (US); Kristof Darmawikarta, Chandler, AZ (US); Srinivas Pietambaram, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 166 days.

(21) Appl. No.: 17/958,012

(22) Filed: Sep. 30, 2022

(65) Prior Publication Data

US 2024/0113007 A1 Apr. 4, 2024

(51) Int. Cl.

| | |
|---|---|
| ***H10W 70/05*** | (2026.01) |
| ***H10W 70/65*** | (2026.01) |
| ***H10W 70/69*** | (2026.01) |
| ***H10W 90/00*** | (2026.01) |

(52) U.S. Cl.

CPC ......... *H10W 70/65* (2026.01); *H10W 70/093* (2026.01); *H10W 70/095* (2026.01); *H10W 70/69* (2026.01); *H10W 90/401* (2026.01); *H10W 90/701* (2026.01); H10W 90/724 (2026.01)

(58) Field of Classification Search

CPC . H10W 70/65; H10W 90/701; H10W 70/093; H10W 70/095; H10W 70/69; H10W 90/401

See application file for complete search history.

(56) References Cited

U.S. PATENT DOCUMENTS

| | | | | |
|---|---|---|---|---|
| 9,196,752 | B2 * | 11/2015 | Baskaran | B81B 7/0006 |
| 2013/0283912 | A1 * | 10/2013 | Lin | G01P 15/0802 73/717 |
| 2021/0246016 | A1 * | 8/2021 | Pindl | G01N 33/0027 |

* cited by examiner

*Primary Examiner* — Michael Jung

(74) *Attorney, Agent, or Firm* — Essential Patents Group, LLP

(57) ABSTRACT

Microelectronic integrated circuit package structures include a first substrate comprising a first bond plane structure on a surface of the first substrate, and a second substrate comprising a second bond plane structure on a surface of the second substrate, where the first and second bond plane structures are in direct physical contact. A conductive trace on the surface of the first substrate is adjacent to a bonding interface between the first and second bond plane structures and over a recessed surface of the first substrate. A first air gap is between the conductive trace and the recessed surface of the first substrate and a second air gap is between the conductive trace and the bonding interface.

17 Claims, 12 Drawing Sheets

AIR GAP ARCHITECTURE FOR HIGH SPEED I/O SUBSTRATE TRACES

BACKGROUND

In electronics manufacturing, integrated circuit (IC) packaging is a stage of manufacture where an IC that has been fabricated on a die or chip comprising a semiconducting material coupled to a supporting case or "package" that can protect the IC from physical damage and support electrical interconnect suitable for further connecting to a host component, such as a printed circuit board (PCB). In the IC industry, the process of fabricating a package is often referred to as packaging, or assembly.

Package substrates for next generation chip-to-chip interconnect technologies require significantly high speed and higher density input/output (I/O) routing. Accordingly, next generation packaging solutions are trending towards higher I/O densities to meet the rapidly increasing demand for greater connectivity and faster speeds. However, future high speed routing architectures may lead to increased signal loss. For example, increasing conductive trace size can decrease routing density and potentially lead to an increase in routing layers. As routing layer density of the traces increases, the signal losses also increase. Organic dielectric materials have been used, but may not provide the desired increase in signal speed.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
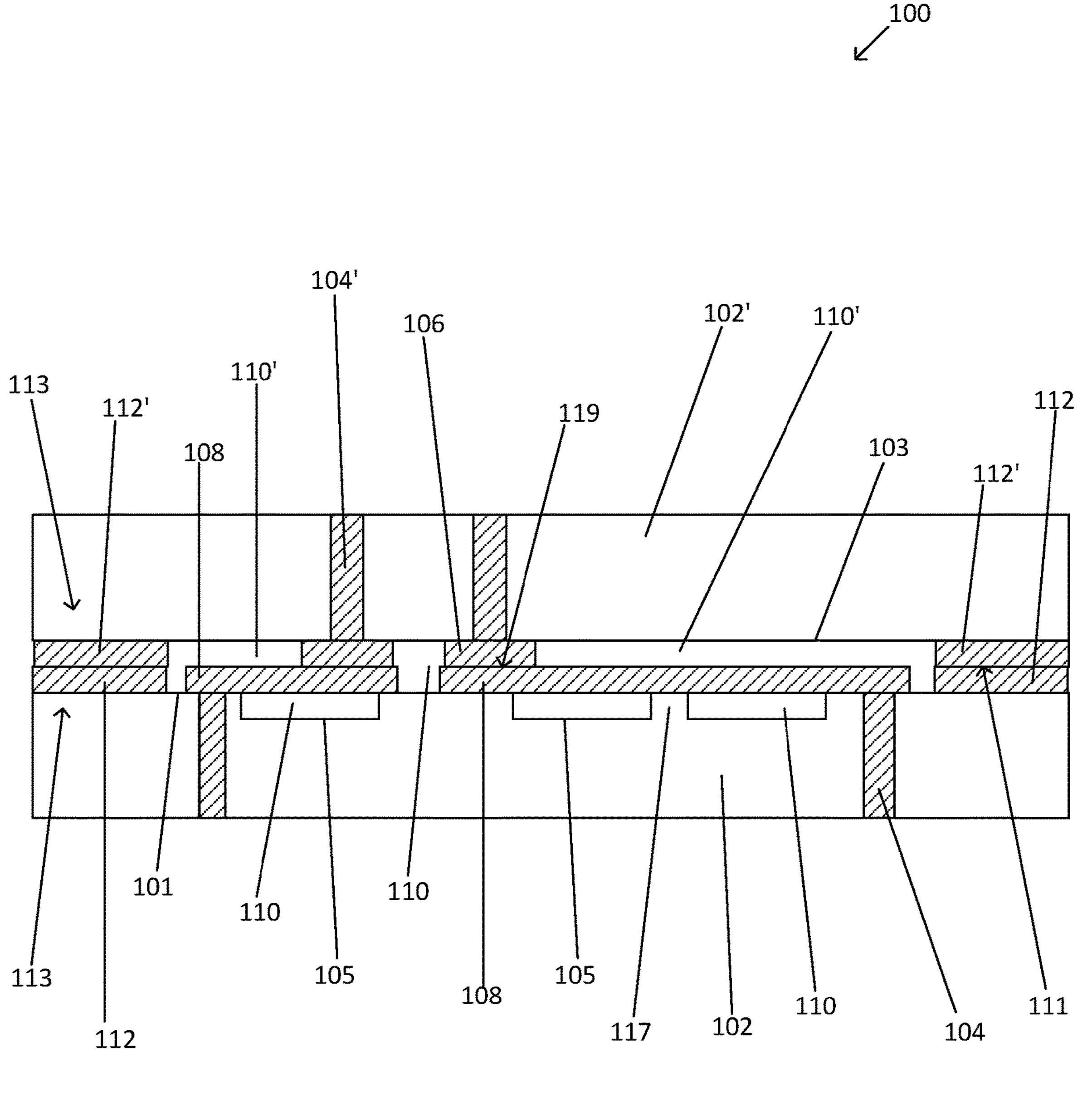
FIGS. 1A-1C are cross-sectional views of an IC package structures comprising one or air gaps around conductive traces, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the explicit context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

The term "dielectric" generally refers to any number of non-electrically conductive materials that make up the structure of a package substrate.

The term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

The term "bond pad" generally refers to metallization structures that terminate integrated traces and vias in integrated circuit packages and dies. The term "solder pad" may be occasionally substituted for "bond pad" and carries the same meaning.

The term "solder bump" generally refers to a solder layer formed on a bond pad. The solder layer typically has a round shape, hence the term "solder bump".

The term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments discussed herein address problems associated with high speed input output (I/O) signal loss. Conductive traces can benefit from utilizing the low dielectric constant of air around high speed conductive traces. Fabricating of air gaps all around high speed (I/O) traces between substrate cores can enable faster high speed signaling.

Embodiments herein describe the fabrication of air gaps around conductive traces, such as high speed I/O conductive traces in substrate cores, such as glass cores. The package structures described herein provide reduced signal loss during operation devices utilizing the package structures described in the various embodiments of the present disclosure. For example, the air gap architectures according to some embodiments herein may include an integrated circuit package where a first substrate is coupled to a second substrate. Air gaps surround conductive traces and are located between a recessed substrate surface and a conductive trace, and between bond plane features and the conductive traces. The first and second substrates may be glass core substrates bonded together with either a metal to metal bond or a dielectric to dielectric bond, according to embodiments.

The all-around air gap architectures described herein may be assembled and/or fabricated with one or more of the features or attributes provided in accordance with various embodiments. A number of different assembly and/or fabrication methods may be practiced to generate microelectronic device structures having increased signal speed and a reduced signal loss according to one or more of the features or attributes described herein.

Figure 1B:
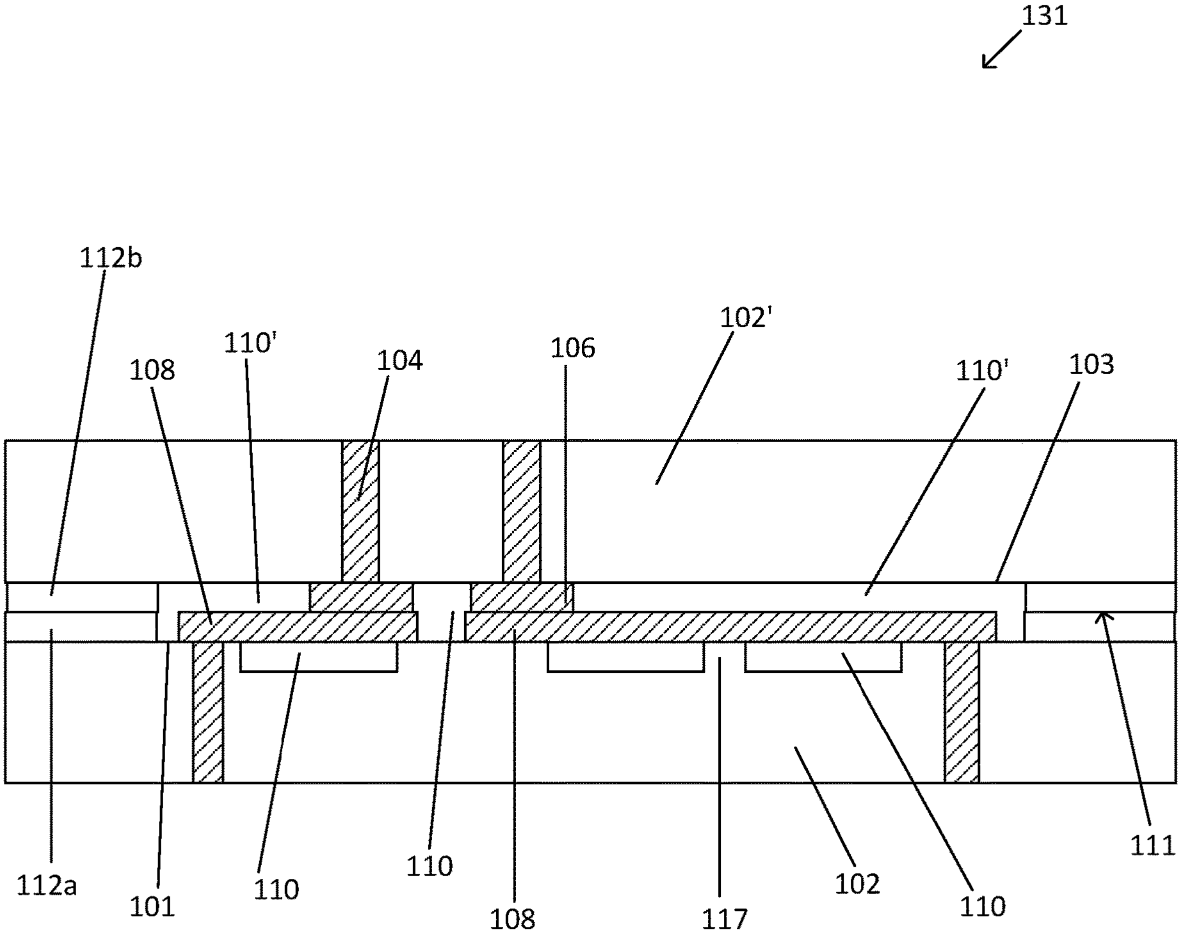
Figure 1C:
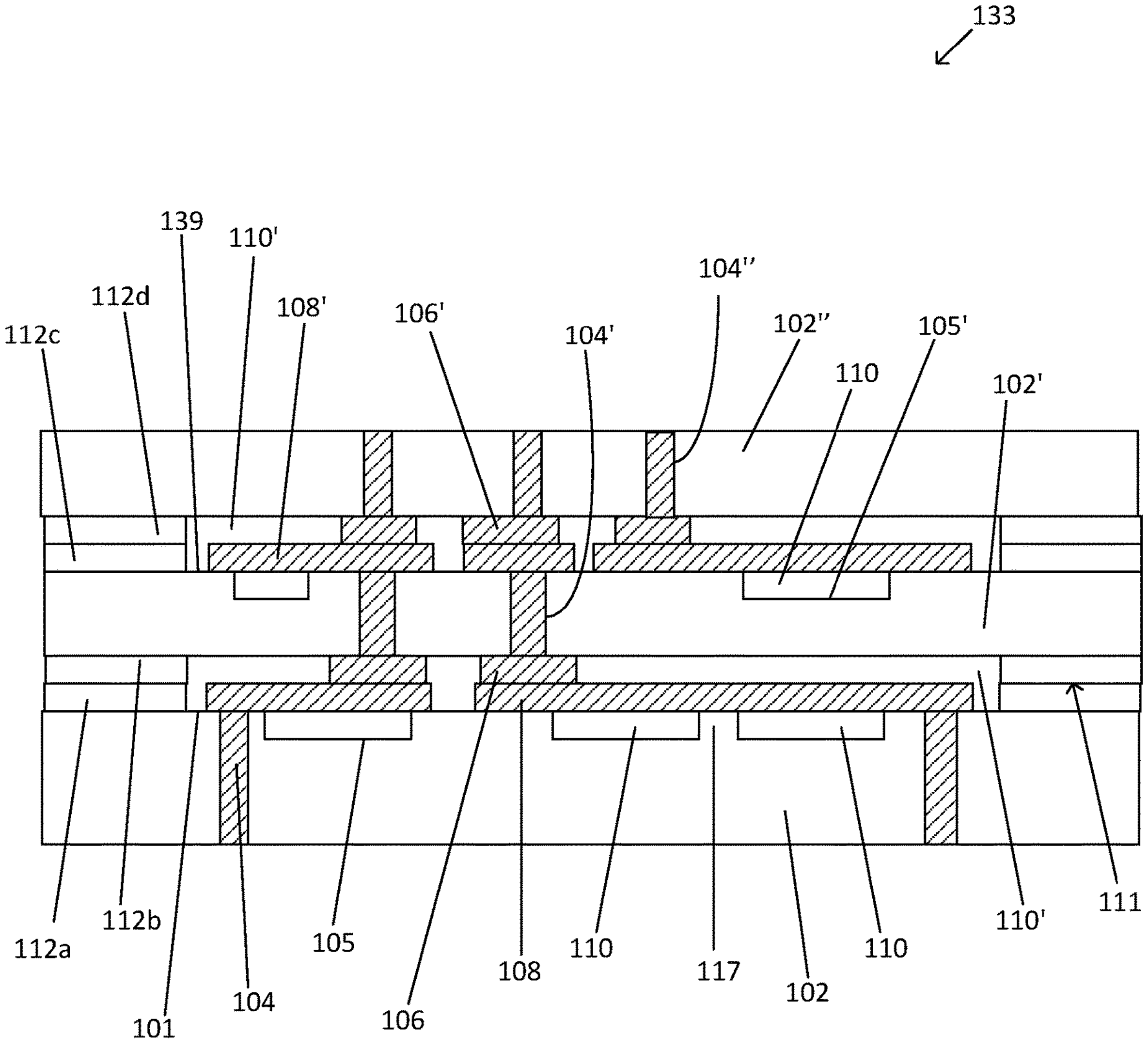

FIGS. 1A-1C illustrate embodiments of package structures to be utilized for substrates of packaged microelectronic devices, in accordance with some embodiments. The air gap architecture for high speed I/O substrate traces includes an air gap surrounding a high speed I/O trace between substrate cores. The package structure(s) are to be used as a portion of a microelectronic device. The air gap surrounding the high speed I/O architecture enables faster high speed signaling within a package substrate structure.

FIG. 1A is a cross-sectional view of an integrated circuit (IC) package structure 100, in accordance with some embodiments. In the embodiment depicted in FIG. 1A, IC package substrate structure 100 includes a first substrate/core 102 and a second substrate/core 102', which have been bonded to each other. The first and second substrates 102, 102' may comprise silicon or glass in some embodiments and may comprise the same or different materials from each other. The substrates 102, 102' may be any appropriate structure, such as a substrate core with at least one dielectric material such as build up films and/or solder resist layers (not shown). The substrates 102, 102' may comprise glass cores 102, 102' in an embodiment.

The substrates 102, 102' may further include conductive interconnect structures such as conductive traces 108, conductive pads 106, and conductive vias 104, 104' extending within and/or through the substrates 102, 102'. In an embodiment, the conductive vias 104, 104' may comprise through glass vias (TGV). The conductive traces 108 may comprise any appropriate conductive material, including, but not limited to metals, such as copper, silver, nickel, gold, or aluminum, alloys thereof, and the like. In an embodiment, the conductive traces comprise a high speed conductive trace capable of operating at high signal speeds.

In an embodiment, the conductive traces 108 are on a surface 101 of the first substrate 102. A first bond plane structure 112, which may comprise a first metal structure 112 in an embodiment, is on the surface of the first substrate 102. A bond plane structure is a structure that may be formed in areas without signal routing, that serves to bond one substrate, such as the first substrate 102, to another substrate. In an embodiment, a bond plane structure may comprise a conductive material or a dielectric material. A second bond plane structure 112, which may comprise a second metal structure 112' in an embodiment, is on a surface 103 of the second substrate 102'. In an embodiment, the first and second metal structures 112, 112' comprise the same material as the conductive trace 108. In an embodiment, the first and second metal structures 112, 112' comprise substantially the same thickness as the conductive traces 108.

In an embodiment, the first metal structure 112 is adjacent to the conductive traces 108 and is on a peripheral portion 113 of the substrate 102. In another embodiment, the first metal structure 112 may be in any space within the substrate where the conductive traces are absent. In an embodiment, the second metal structure 112' is adjacent to the conductive traces 108 and is on a peripheral portion 113' of the second substrate 102'. In an embodiment, the metal structures 112, 112' are in direct physical contact with each other. A metal to metal bond is at an interface region 111 between the first and second metal structures 112, 112'. Additionally, metal to metal bonding may be at an interface region 119 between a pad 106 and a conductive trace 108 (wherein a portion of the conductive trace may comprise a pad at terminal ends in some embodiments). In an embodiment, the first and second metal structures 112, 112' may comprise conductive materials such as copper or copper alloys. In an embodiment, the first and second metal structures 112, 112' may comprise any suitable conductive materials.

In an embodiment, a first air gap 110 may be between a recessed surface 105 of the first substrate 102 and the high speed trace 108. A second air gap 110' may be adjacent to the bond interface region 111 between the first and second metal structures 112, 112'. A pylon structure 117 may be between adjacent second air gaps 110'. The first and second air gaps 110, 110' provide air gaps all around the conductive traces 108 and are between the first and second substrates 102, 102'. Since the dielectric constant of air is one, the air gaps 110, 110' enable high speed signaling for devices incorporating the IC package structure 100. The number and location of air gaps 110, 110' surrounding the conductive traces 108 may vary depending upon the design needs of the particular application. Herein, an air gap may be filled with air or other gas such as an inert or nonreactive gas.

FIG. 1B depicts a cross-sectional view of an integrated circuit (IC) package structure 131, in accordance with some embodiments. IC package substrate structure 131 includes a first substrate/core 102 and a second substrate/core 102', which have been bonded to each other. The first and second substrates 102, 102' may comprise silicon or glass in some embodiments and may comprise the same or different materials from each other. The substrates 102, 102' may be any appropriate structure, such as a substrate core with at least one dielectric material such as build up films and/or solder resist layers (not shown). The substrates 102, 102' may comprise glass cores 102, 102' in an embodiment.

The substrates 102, 102' may further include conductive interconnect structures such as conductive traces 108, conductive pads 106, and conductive vias 104, 104' extending within and/or through the substrates 102, 102'. In an embodiment, the conductive vias 104, 104' may comprise TGVs. The conductive traces 108 may comprise any appropriate conductive material, including, but not limited to metals, such as copper, silver, nickel, gold, or aluminum, alloys thereof, and the like. In an embodiment, the conductive traces comprise high speed conductive traces.

In an embodiment, the conductive traces 108 are on a surface 101 of the first substrate 102. A first bond plane structure 112 is on the surface of the first substrate 102, and a second bond plane structure 112' is on a surface 103 of the second substrate 102'. In an embodiment, the first and second metal structures 112, 112' comprise a dielectric material. In an embodiment, the first bond plane structures 112, comprise substantially the same thickness as the conductive traces 108. In an embodiment, the first bond plane structure 112 is adjacent to the conductive traces 108 and is on a peripheral portion 113 of the substrate 102. In an embodiment, the second bond plane structure 112' is adjacent to the conductive traces 108 and is on a peripheral portion 113' of the second substrate 102'.

In an embodiment, the first and second bond plane structures 112, 112' are in direct physical contact with each other. A dielectric to dielectric bond is at an interface region 111 between the first and second bond plane structures 112, 112'. Additionally, metal to metal bonding may be at an interface region 119 between a pad 106 and a conductive trace 108. In an embodiment, the first and second bond plane structures 112, 112' may comprise dielectric materials such as silicon dioxide or silicon nitride for example.

In an embodiment, a first air gap 110 may be between a recessed surface 105 of the first substrate 102 and the high speed trace 108. A second air gap 110' may be adjacent to the bond interface region 111 between the first and second metal structures 112, 112'. A pylon structure 117 may be between two adjacent second air gaps 110'. The first and second air gaps 110, 110' provide air gaps all around the conductive traces 108 and between the first and second substrates 102, 102'. The air gaps 110, 110' enable high speed signaling for devices incorporating the IC package structure 100. The number and location of air gaps 110, 110' surrounding the conductive traces 108 may vary depending upon the design needs of the particular application.

FIG. 1C depicts a cross-sectional view of an integrated circuit (IC) package structure 133, in accordance with some embodiments. IC package substrate structure 133 includes a first substrate/core 102, a second substrate/core 102', and a third substrate core 102" which have been bonded to/stacked upon each other. Although FIG. 1C depicts three substrates bonded to each other, there may be any number of substrates bonded to each other, in various embodiments. The first, second and third substrates 102, 102', 102" may comprise silicon or glass in some embodiments and may comprise the same or different materials from each other. The substrates 102, 102', 102" may be any appropriate structure, such as a substrate core with at least one dielectric material such as build up films and/or solder resist layers (not shown). The substrates 102, 102'103' may comprise glass cores 102, 102', 102" in an embodiment.

The substrates 102, 102', 102" may further include conductive interconnect structures such as conductive traces 108, 108' conductive pads 106, 106' and conductive vias 104, 104', 104" extending within and/or through the substrates 102, 102', 102' respectively. In an embodiment, the conductive vias 104, 104', 104' may comprise TGV's. The conductive traces 108, 108' may comprise any appropriate conductive material, including, but not limited to metals, such as copper, silver, nickel, gold, or aluminum, alloys thereof, and the like. In an embodiment, the conductive traces 108, 108' comprise high speed conductive traces.

In an embodiment, the conductive traces 108, 108' are on surfaces 101, 139 of the first and second substrates 102, 102'. First and second bond plane structures 112*a*, 112*b* are between the first and second substrates 102, 102' and third and fourth bond plane structures 112*c*, 112*d* are between the second and third substrates 102', 102". In an embodiment, the first, second, third, and fourth bond plane structures 112*a*, 112*b*, 112*c*, 112*d* comprise either a dielectric material or a conductive material. In an embodiment, the first and second bond plane structures 112*a*, 112*b* are adjacent to the conductive traces 108. In an embodiment, the third and fourth bond plane structures 112*c*, 112*d* are adjacent to the conductive traces 108'.

In an embodiment, the first and second bond plane structures 112*a*, 112*b* are in direct physical contact with each other and are bonded together with either a metal to metal bond or a dielectric to dielectric bond. In an embodiment, the third and fourth bond plane structures 112*c*, 112*d* are in direct physical contact with each other and are bonded together with either a metal to metal bond or a dielectric to dielectric bond. Additionally, metal to metal bonding may be at an interface region between a pad 106 and a conductive trace 108, and between a pad 106' and a conductive trace 108'.

In an embodiment, air gaps 110 may be between a recessed surface 105 of the first substrate 102 and the high speed trace 108, and may be between a recessed surface 105' of the second substrate 102' and the high speed trace 108'. A second air gap 110' may be adjacent to the first and second bond plane structures 112*a*, 112*b* and may be adjacent to the third and fourth bond plane structures 112, 112'. A pylon structure 117 may be between two adjacent second air gaps 110'. The number and location of air gaps 110, 110' surrounding the conductive traces 108, 108' may vary depending upon the design needs of the particular application.

Figure 2A:
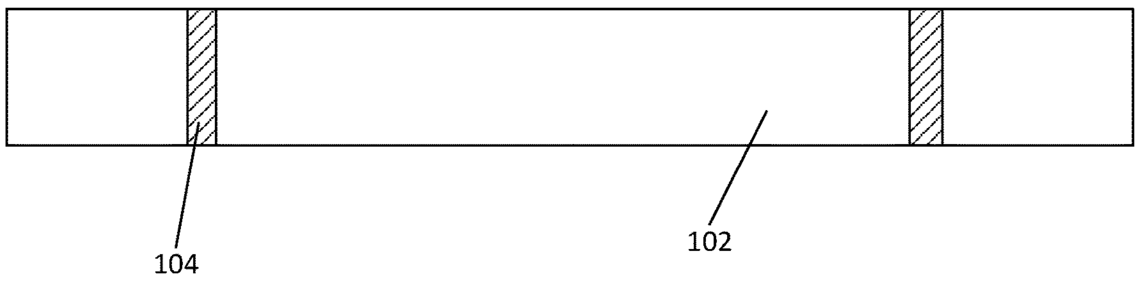
FIGS. 2A-2I illustrate cross-sectional views of structures formed during the fabrication of IC package structures comprising one or more air gaps around conductive traces, in accordance with some embodiments.

FIGS. 2A-2I illustrate embodiments of forming an IC package structure (such as the IC package structures of FIG. 1A-1C). FIG. 2A depicts a cross-sectional view of a portion of an IC package structure according to some embodiments. As shown, a substrate 102 may be provided. Substrate 102 may include conductive material with dielectric material interspersed within substrate 102. Substrate 102 may additionally include integrated circuitry fabricated according to any suitable microelectronic technology such as complementary metal oxide semiconductor (CMOS), SiGe, III-V or III-N HEMTs, etc.) techniques or others. For example, substrate 102 may include any number of active or passive devices. In some embodiments, substrate 102 may be an interposer or a PC board in some embodiments. In some embodiments, the substrate 102 may comprise a glass core 102. The substrate 102 may comprise a via 104, which may comprise a through glass via, in an embodiment. In an embodiment, the via 104 may comprise a conductive material, such as a plated copper material, for example.

Figure 2B:
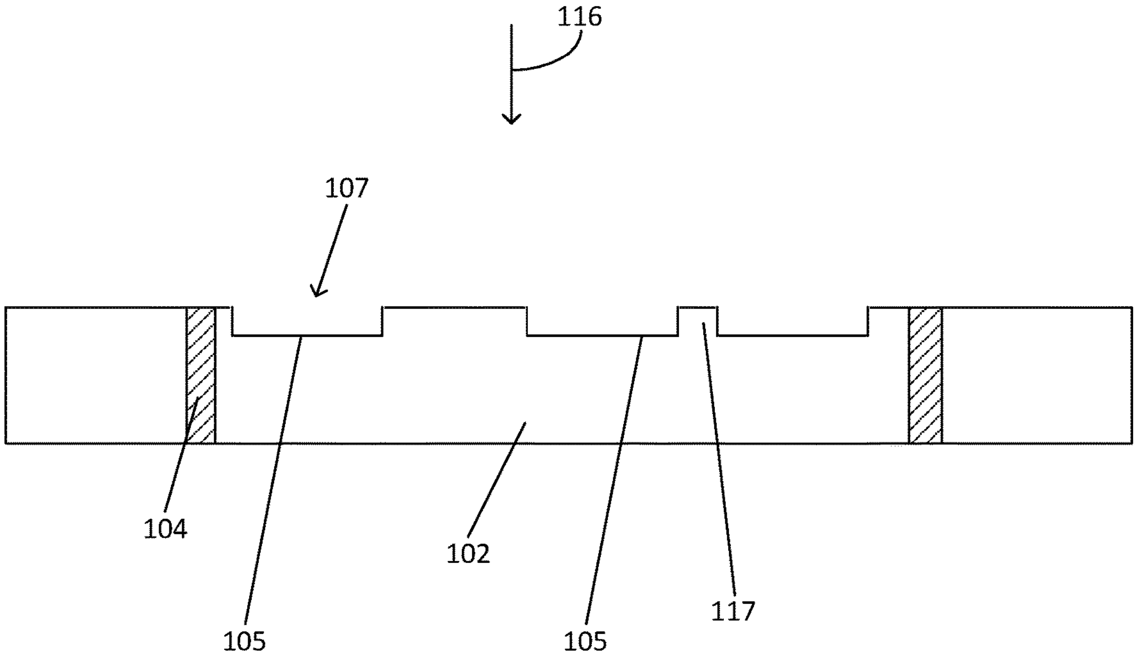

A removal process 116 may be employed to form openings 107 in the substrate 102, as depicted in FIG. 2B. The removal process 116 may comprise a laser treatment with a wet etch, a soft or hard masking followed by a plasma etch, or any other suitable process to form a recessed surface 105 of the substrate 102. The number and dimensions of the recessed surfaces may depend upon the design requirements of the particular application. In an embodiment, a pylon structure 117 may be formed in the substrate 102. The term pylon or pylon structure as used herein indicates a structure that vertically spans from recessed surface 105 to a top surface of the substrate 102. For example, a pylon structure 117 may be used to support a conductive trace.

Figure 2C:
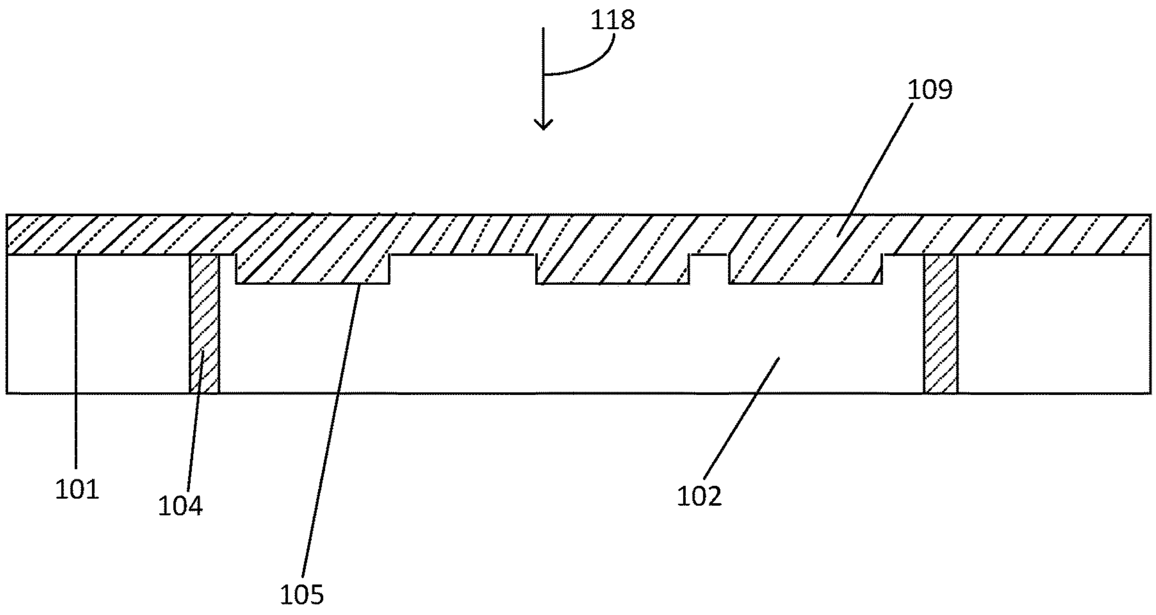

As shown in FIGS. 2C, a dielectric material 109 may be formed and patterned on a surface 101 and on the recessed surfaces 105 of the substrate 102, by utilizing a formation process 118. Formation process 132 may be any suitable formation process, such as lamination, spin coating and dry deposition processes for example. The dielectric material 109 may comprise a sacrificial dielectric material and may comprise any suitable sacrificial dielectric material, for example.

Figure 2D:
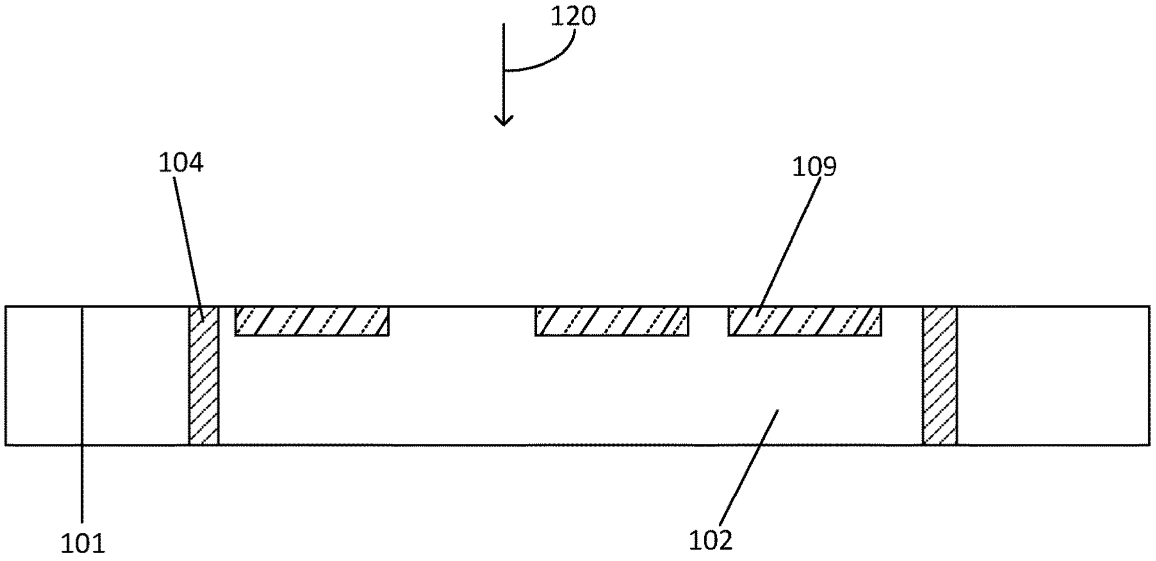

In FIG. 2D the dielectric material 109 may be removed utilizing a removal process 120 from the surface 103 of the substrate 102 such that it remains only on the recessed surface 105 of the substrate 102. The removal process may comprise any suitable removal process, such as a chemical mechanical polishing process (CMP) for example so that the surface of the dielectric material is coplanar with the surface of the substrate 101.

Figure 2E:
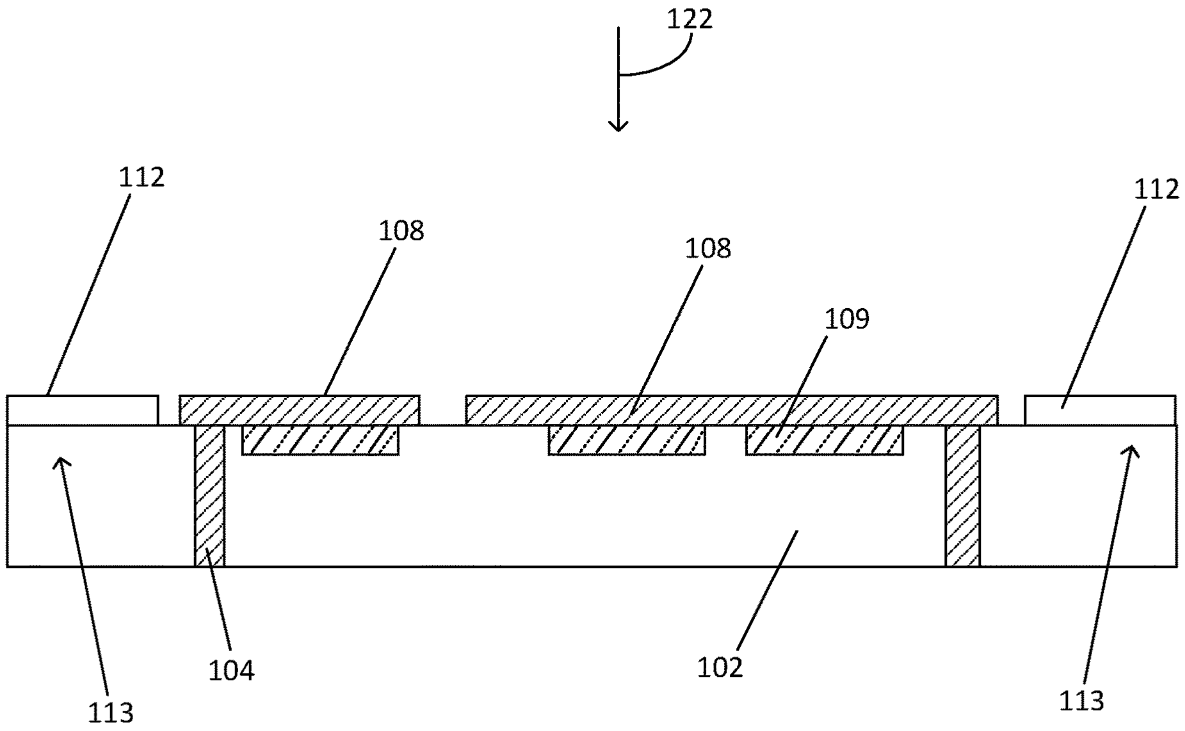

In FIG. 2E, first plane structures 112 may be formed in peripheral regions 113 of the substrate by utilizing a formation process 122. In an embodiment, (as shown in FIG. 1A) the first plane structures 112 may comprise a conductive material such as copper or copper alloys and the like. In an embodiment, the formation process may comprise a plating process. In an embodiment, the first plane structures 112 may be electrically grounded. In other embodiments, the first plane structures 112 may comprise a dielectric material, such as a silicon oxide material or silicon nitride material, for example (as shown in FIG. 1B), and may be formed utilizing any suitable dielectric formation process. Conductive traces 108 may be formed in the same formation process 122 (in the case where the conductive traces 108 and the first plane structures 112 comprise the same conductive material) or may be formed with a different formation process, when the first plane structures comprise a dielectric material. The conductive traces 108 are formed on the surface 101 of the first substrate 102 between the first plane structures 112.

Figure 2F:
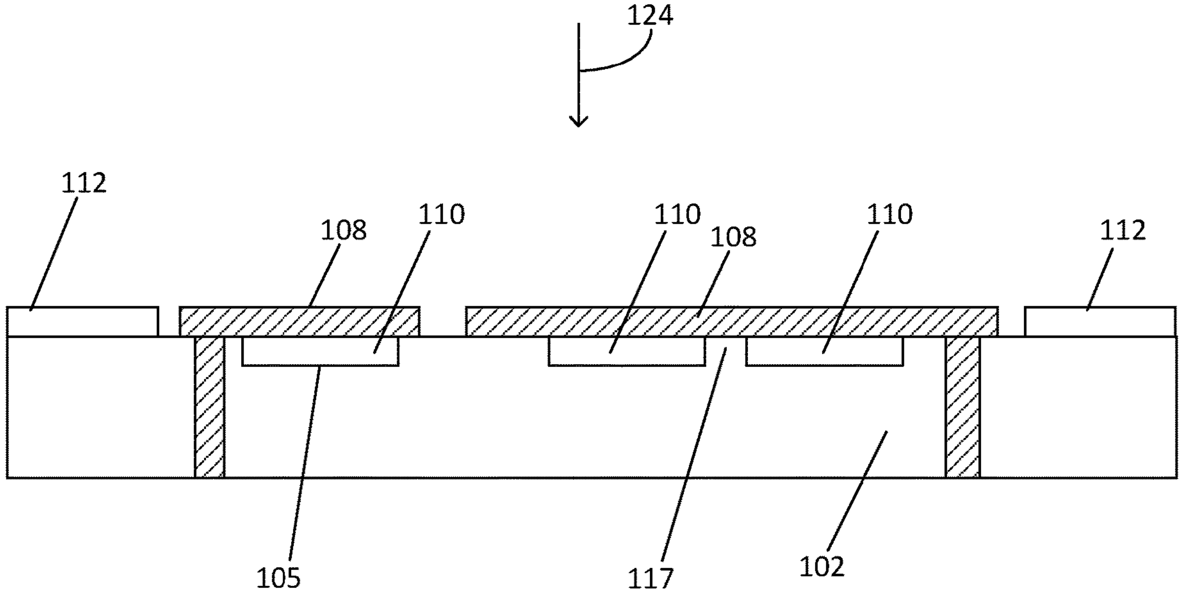

In FIG. 2F, the sacrificial dielectric material 109 is removed by utilizing a removal process 124, such as a selective dry and/or a wet etch for example, but any suitable removal process 124 may be utilized as are known in the art. The removal of the sacrificial dielectric material 109 creates air gaps 110 between the recessed surface 105 of the substrate 102 and the conductive trace 108. Pylon structures 117 can be utilized to facilitate support of the conductive traces 108 according to the particular design requirements, but in some embodiments may not be necessary and are thus not present within the IC package structure of the embodiments described herein. The pylon structure 117 length, height, location, spacing, and the conductive trace width, trace stubbing, etc. can be optimized to reduce impedance mismatch/signal reflections at the locations where the conductive traces 108 are over the pylon structure 117, and will be described further herein.

Figure 2G:
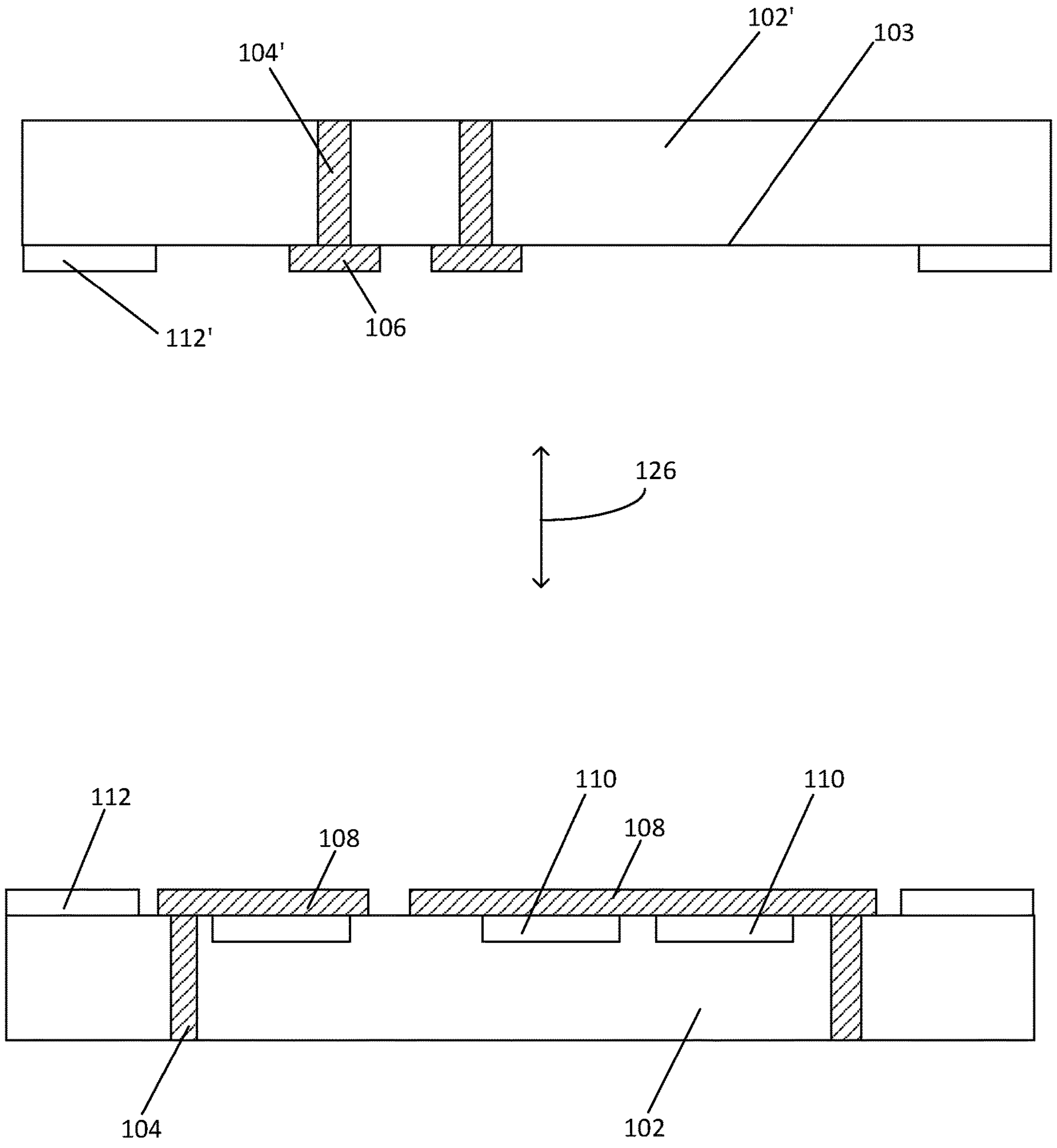
Figure 2H:
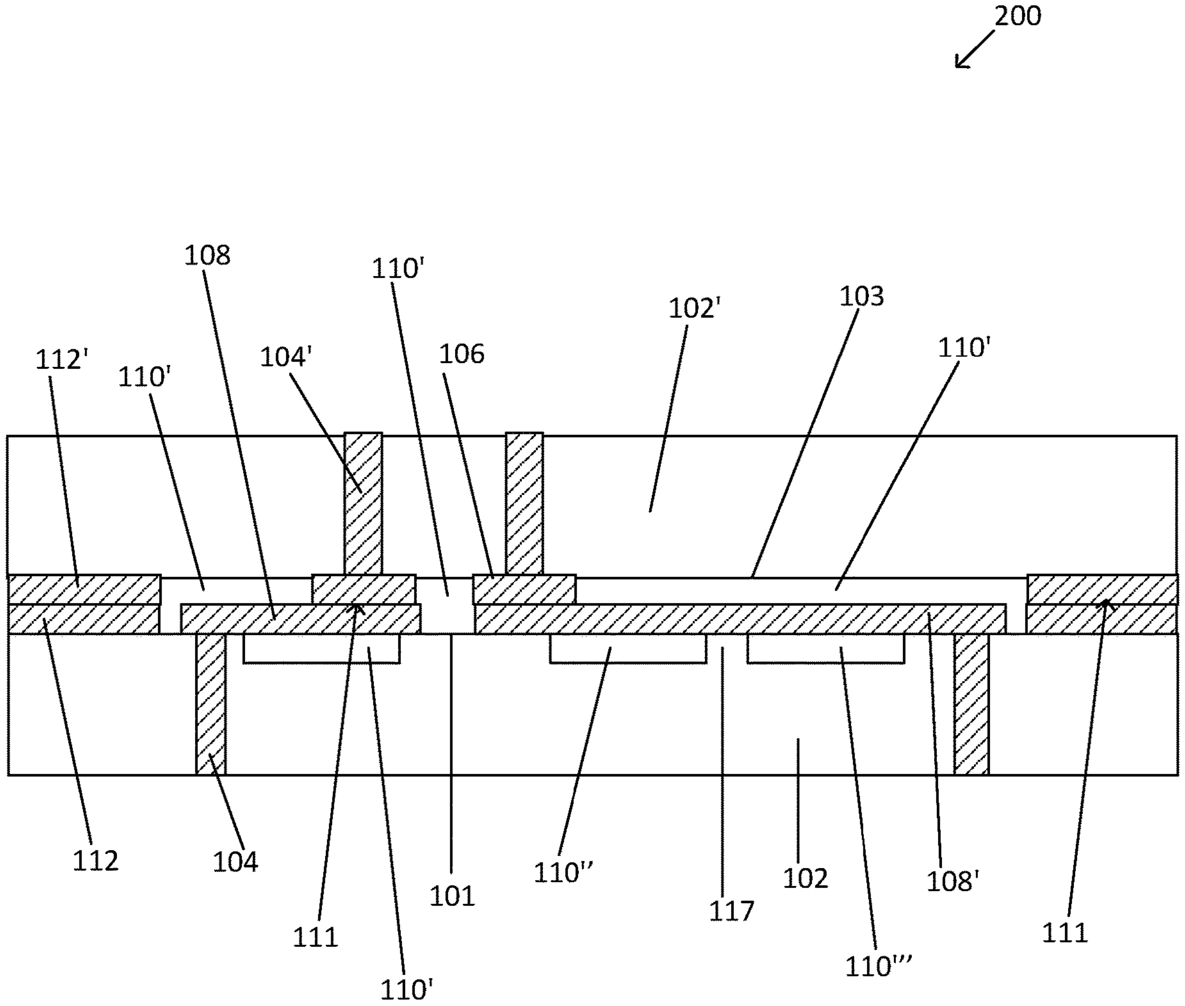

In FIG. 2G a second substrate 102' may be bonded to the first substrate 102' by utilizing a bonding process 126 to form an integrated circuit (IC) package structure 200 (FIG. 2H). In an embodiment, the second substrate 102' may comprise a glass core with TGV's extending through the glass core 102' and pads 106 on a surface 103 of the second substrate 102'. The second substrate 102' may further comprise a second plane structure 112' on the surface 103 of the second substrate 102'. The first and second substrates 102, 102' may be bonded to one another by using a metal to metal bonding process 126, in an embodiment.

During the metal bonding process 126, heat and pressure may be applied to the first and second substrates 102, 102' to form a metal to metal bond interfaces 111 between the bond pads 104 on the second substrate 102' and the conductive trace 108 on the first substrate. In some embodiments, the conductive trace 108 may be on a surface of the second substrate 102'. Metal to metal bond interface 111 may also be formed between the first and second plane structures 112, 112' of the first and second substrates 102' respectively. (FIG. 2H). In an embodiment, a first and second air gap 110, 110' may provide air gaps all around the conductive trace 108, thus improving signal speed of the conductive trace 108 by providing a low dielectric constant material (air) surrounding the conductive trace. In another embodiment, second and third air gaps 110", 110'" may provide air gaps all around the conductive trace 108'. The second and third conductive traces 110", 110'" are separated from each other by a pylon structure 117, which may provide physical support for the conductive trace 108, in an embodiment.

Figure 2I:
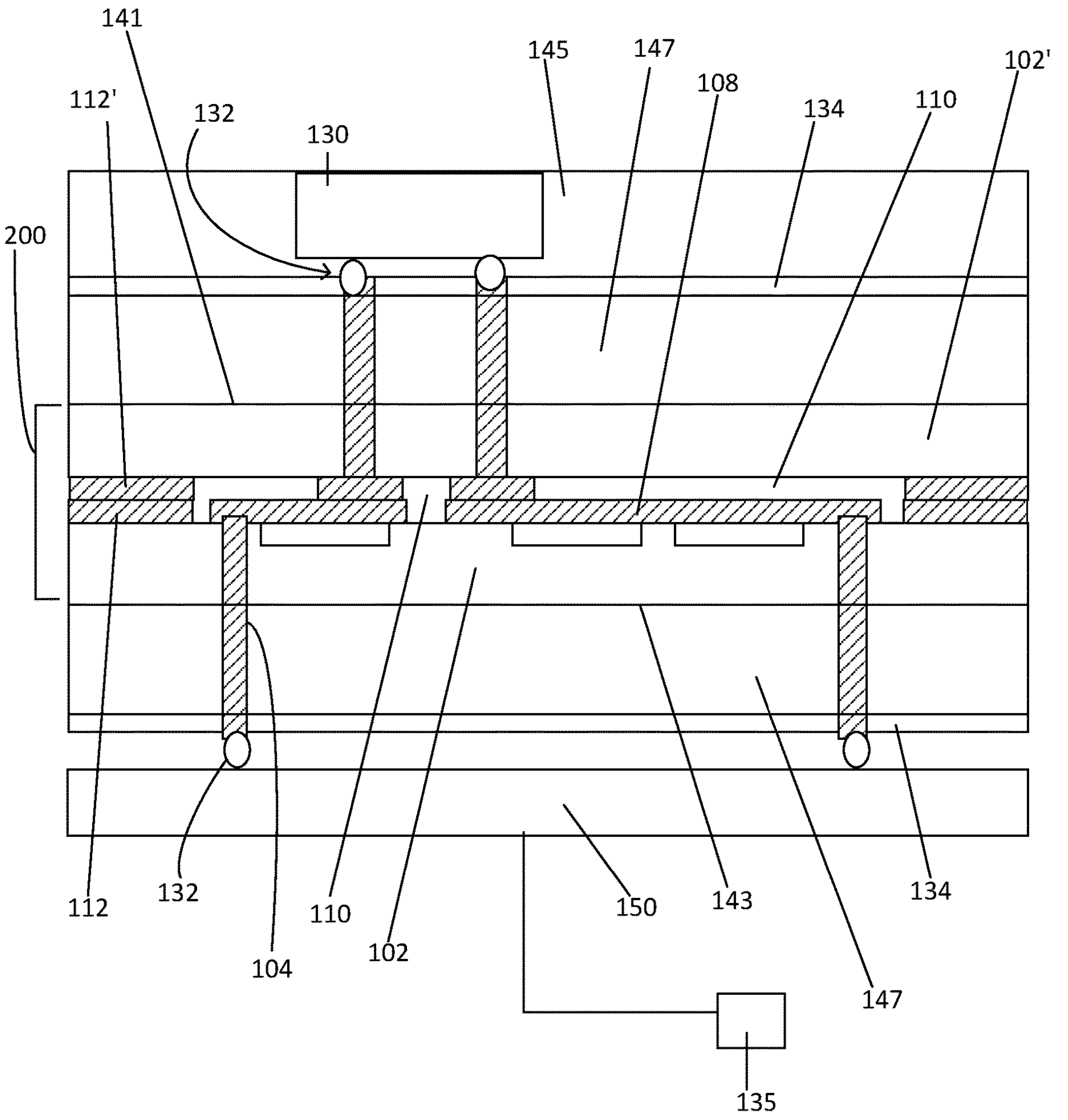

As shown in FIG. 2I, a die 130 may be coupled to the IC package structure 200 and may be over a first side 141 of the IC package structure 200. A substrate 150 may be coupled to the IC package structure 200 and may be over a second side 143 of the IC package structure 200. The die 130 may be any appropriate die/device, including, but not limited to, a microprocessor, a chipset, a graphics device, a wireless device, a memory device, an application specific integrated circuit, a transceiver device, an input/output device, combinations thereof, stacks thereof, or the like. The die 130 may be surrounded by a mold material 145 such as an epoxy material, as is known in the art.

The die 130 is electrically coupled to the IC package structure 200 through ball interconnect structures 132. As used herein, the term ball interconnect structures indicate any structure or conductive element for coupling to an outside die or other device. In an embodiment, ball interconnect structures 132 include a solder structure. For example, ball interconnect structures 132 may be solder balls. As used herein, the term solder balls indicate an interconnect structure prior to or after reflow. The ball interconnect structures 132 may include one or more of silver, tin, or copper, or combinations or alloys thereof. The substrate 150 may be any suitable substrate such as an interposer or a board, for example, and may be coupled to IC package structure 200 through conductive interconnect structures 132. A build up material 147 may be on the first and second sides 141, 143 of the IC package structure 200. The build up material 147 may comprise many layers of routing/metallization and dielectric materials which may be vertically connected with vias. A solder material 134 may be on the build up material 147. A power supply 135, which may comprise any suitable power supply as known in the art, may be coupled to the die 130 via the IC package structure 200, in an embodiment.

Figure 3A:
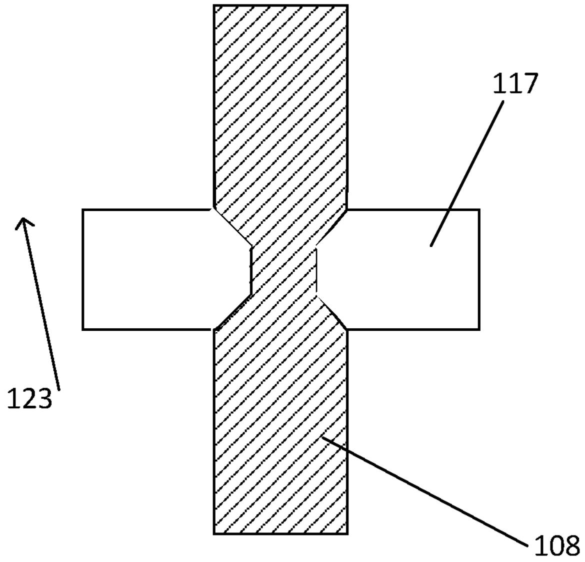
FIGS. 3A-3B illustrate cross-sectional views of structures formed during the fabrication of IC package structures comprising one or more air gaps around conductive traces, in accordance with some embodiments.
Figure 3B:
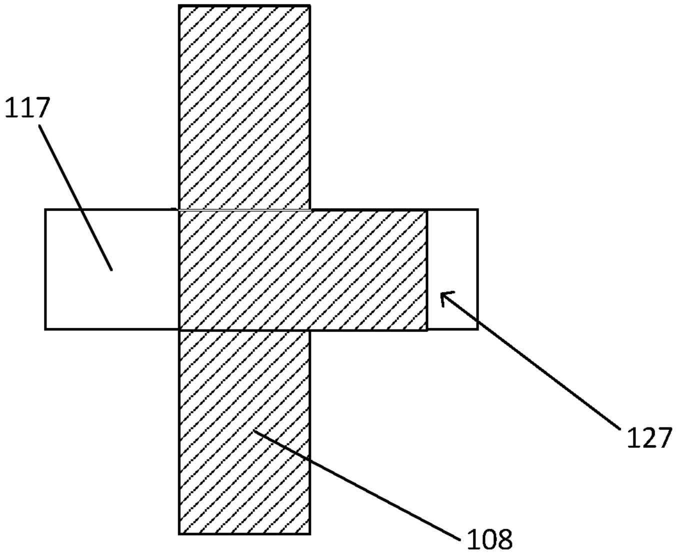

FIGS. 3A-3B depict various conductive trace structures 117 designed to reduce impedance mismatch or signal reflection in regions where the conductive trace 108 is over the pylon structure 117 adjacent to the air gaps within the IC package structure, such as IC package structure of FIG. 2H, for example). In FIG. 3A, the conductive trace 108 comprises a tapered/narrowed width 123 in the region where the conductive trace 108 is over the pylon structure 117. In FIG. 3B, the conductive trace 108 comprises a rectangular extension 127 in the region where the conductive trace 108 is over the pylon structure 117. In an embodiment, the rectangular extension may be in any direction relative to the conductive trace 108 and may be a different dimension as compared to the dimensions of the pylon structure 117.

Discussion now turns to operations for assembling and/or fabricating the discussed structures.

Figure 4:
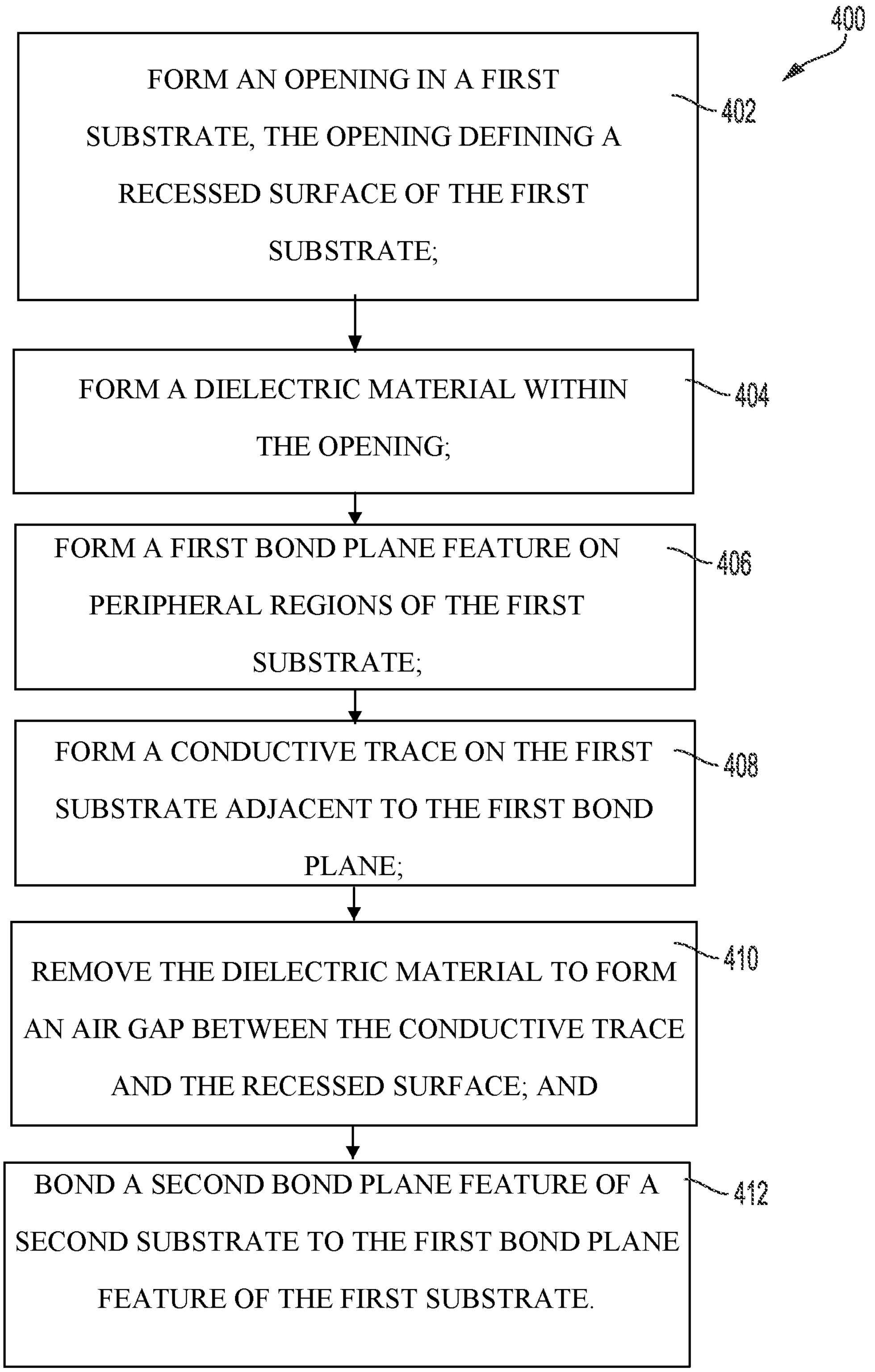
FIG. 4 illustrates a flow chart of a process for the fabrication of IC package structures having one or more air gaps around conductive traces, in accordance with some embodiments.

FIG. 4 is a flow chart of a process 400 of fabricating a microelectronic IC package structure according to some embodiments. For example, process 400 may be used to fabricate any of the microelectronic IC package structures of FIGS. 2A-2I.

As set forth in block 402, one or more openings are formed in a first substrate, such as a package substrate. The first substrate may comprise any suitable material, such as a glass or a silicon material. The first substrate may comprise a glass core in an embodiment. The first substrate may further include through glass vias within and extending through the first substrate. The openings may be formed using laser processing, wet etching processes, utilizing a soft mask or a hard mask process followed by a plasma etch process, and any other suitable opening formation process as are known in the art. The openings may comprise a depth of between about 100 microns and about 5 mm and a width of between about 30 microns and 1 mm. The first substrate may be any substrate discussed herein having any number and layout of interconnect structures.

As set forth in block 404, a dielectric material may be formed within the openings in the first substrate. In an embodiment, the dielectric material may comprise any suitable sacrificial dielectric material. The dielectric material may be formed using a lamination process, for example. In an embodiment, the dielectric material comprises a sacrificial dielectric material in that it is to be removed during subsequent processing.

As set forth in block 406, a first bond plane feature may be formed on peripheral regions of the first substrate. In an embodiment, the first bond plane may comprise a conductive material, such as copper for example. In another embodiment, the first bond plane feature may comprise a dielectric material, such as silicon dioxide or silicon nitride. The first bond plane feature may be formed using any suitable formation process. For example, when the first bond plane feature comprises a conductive material a plating process may be utilized. Alternatively, when the first bond plane feature comprises a dielectric material a dielectric formation process may be utilized, such as lamination, for example.

As set forth in block 408, a conductive trace may be formed on the first substrate adjacent to the first bond plane. In an embodiment, the conductive trace is formed between the first bond plane features (as shown in FIG. 2H, for example). In an embodiment, the conductive trace may comprise a high speed conductive trace. The conductive trace may be formed using any suitable process, such as a plating process, for example. In an embodiment, the conductive trace may comprise a thickness of about 1 micron and 100 microns and may be substantially the same thickness as a thickness of the first bond plane feature. In some embodiments, the conductive trace may comprise a copper material or a copper alloy.

As set forth in block 410, the dielectric material may be removed to form an air gap between the conductive trace and the recessed surface. In an embodiment, the dielectric material may be removed from the openings in the substrate by using any combination of wet or dry etch processes. By removing the dielectric material, the air gap formed around the conductive trace allows for greater signal speed capability of the trace due to the low dielectric constant of air.

As set forth in block 412, a second bond plane feature of a second substrate may be bonded to the first bond plane feature of the first substrate. The second substrate may comprise a glass core with through glass vias (TGV) extending within the glass core, wherein a bond pad is coupled to the (TGV) and is at least partially on a surface of the second substrate. The second bond plane feature may be in peripheral portions of the second substrate, such that the first and second bond plane features are aligned with each other and are in direct contact with each other during the bonding process.

During the bonding process, heat and pressure may be applied to press the first and second substrates together and to bond the first and second bond plane features together. In an embodiment, the first and second bond plane features comprise a conductive material, and metal to metal bonds are formed at a bonding interface between the first and second bond planes. In another embodiment, the first and second bond plane features comprise a dielectric material, and dielectric to dielectric bonds are formed at a bonding interface between the first and second bond planes. Additionally, metal to metal bonds are formed between the bond pads on the surface of the second substrate and a surface of the conductive trace. In an embodiment, the first and second substrates may be bonded together utilizing a nitrogen/hydrogen mixed atmosphere at 300 degrees Celsius, 0.8 MPa for about 1 hour with an automated wafer bonding system.

The bonding process forms one or more air gaps around the conductive traces, between the first substrate and the second substrate. Consequently, the conductive traces are surrounded by air gaps formed by either the bonding of the two substrates or by formation after removal of the sacrificial dielectric material. The conductive traces and pads can be located on just one or on both of the substrates/cores in an embodiment. The number and dimensions of the pads can vary as well, which can be optimized to enhance the bonding of the substrates to each other. By providing air gaps which surround the conductive traces, the conductive traces of the embodiments herein exhibit less signal loss and increased signal speed.

Figure 5:
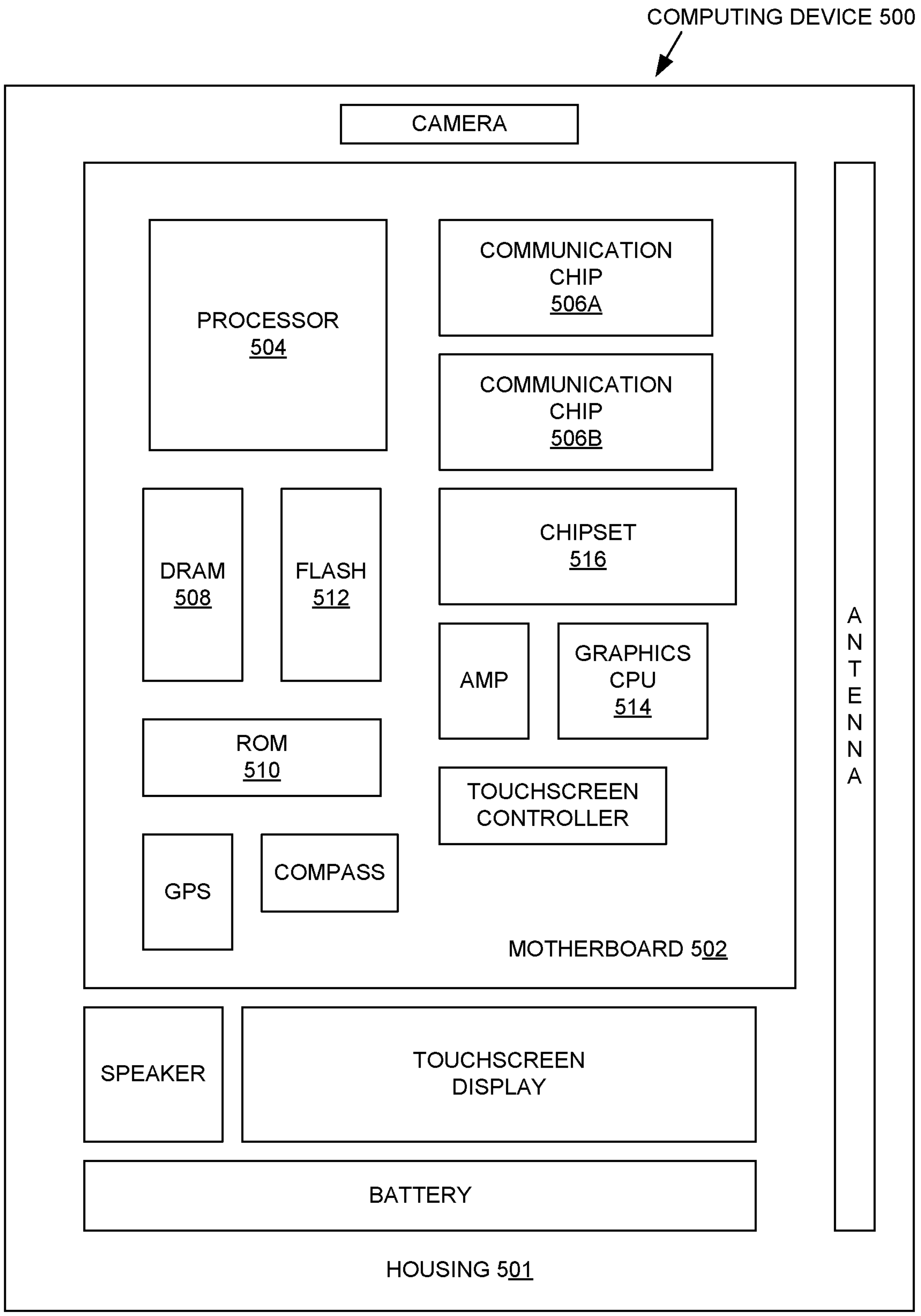
FIG. 5 is a functional block diagram of an electronic computing device, in accordance with some embodiments of the present disclosure.

FIG. 5 illustrates an electronic or computing device 500 in accordance with one or more implementations of the present description. The computing device 500 may include a housing 501 having a board 502 disposed therein. The computing device 500 may include a number of integrated circuit components, including but not limited to a processor 504, at least one communication chip 506A, 806B, volatile memory 508 (e.g., DRAM), non-volatile memory 810 (e.g., ROM), flash memory 512, a graphics processor or CPU 514, a digital signal processor (not shown), a crypto processor (not shown), a chipset 516, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. At least one of the integrated circuit components may include an electronic substrate having air gaps surrounding the conductive traces. In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It is understood that the subject matter of the present description is not necessarily limited to specific applications illustrated in FIGS. 1-8. The subject matter may be applied to other integrated circuit devices and assembly applications, as well as any appropriate electronic application, as will be understood to those skilled in the art.

The following examples pertain to further embodiments and specifics in the examples that may be used anywhere in one or more embodiments, wherein a first example is an integrated circuit (IC) package structure, comprising an integrated circuit package structure, comprising a first substrate comprising a first metal structure on a surface of the first substrate; a second substrate comprising a second metal structure on a surface of the second substrate, wherein the first and second metal structures are in direct physical contact at a bonding interface therebetween; a conductive trace on the surface of the first substrate adjacent to the bonding interface and over a recessed surface of the first substrate; and a first air gap between the conductive trace and the bonding interface and a second air gap between the conductive trace and the recessed surface of the first substrate.

In second examples, the first example includes wherein the first and second substrates comprise glass.

In third examples, for any of examples 1-2 wherein a portion of the first air gap is between the first substrate and the second substrate.

In fourth examples, for any of examples 1-3 wherein the first metal structure and the conductive trace comprise the same material.

In fifth examples, for any of examples 1-4 wherein a third air gap is adjacent the second air gap.

In sixth examples, for any of examples 1-5 wherein a pylon is between the second air gap and the third air gap.

In seventh examples, for any of the examples 1-6 wherein a portion of the conductive trace on the pylon comprises one of a narrowed width, or a rectangular extension.

In eighth examples, for any of the examples 1-7 wherein the second substrate comprises a third metal structure on a side opposite the second metal structure, wherein the third metal structure is in direct physical contact with a fourth metal structure on a surface of a third substrate, and wherein a third air gap is between the fourth metal structure and a conductive trace on the surface of the third substrate.

In ninth examples, for any of the examples 1-8 wherein the conductive trace comprises a high speed trace.

In tenth example for any of the examples 1-9 wherein the first metal structure and the conductive trace comprise substantially the same thickness.

An eleventh example is an integrated circuit (IC) package structure, comprising: a first substrate comprising a first plane structure on a surface of the first substrate; a second substrate comprising a second plane structure on a surface of the second substrate, wherein the first and second plane structures are in direct physical contact with each other; a conductive trace on the surface of the first substrate adjacent to the first plane structure; an air gap between the conductive trace and a bond interface between the first and second plane structures; an integrated circuit die coupled to at least one of the first substrate or the second substrate; and a power supply coupled to IC package to provide power to the integrated circuit die.

In twelfth examples, example 11 includes wherein the first and second plane structures comprise a dielectric material or a conductive material.

In thirteenth examples, for any of examples 11-12 wherein the conductive material comprises copper or a copper alloy.

In fourteenth examples, for any of the examples 11-13 wherein the dielectric material comprises one or more of silicon, nitrogen, or oxygen.

In fifteenth examples, for any of the examples 11-14 wherein the first and second plane structures comprise a combined height of between 1 micron and 100 microns.

In sixteenth examples for any of the examples 11-15 wherein a height of the air gap is between 1 micron to 30 microns.

In seventeenth examples, for any of the examples 11-16 wherein the conductive trace is substantially coplanar with the bond interface.

An eighteenth example is a method of forming a package structure, comprising: forming an opening in a first substrate, the opening defining a recessed surface of the first substrate; forming a dielectric material within the opening; forming a first bond plane feature on peripheral regions of the first substrate; forming a conductive trace on the first substrate adjacent to the first bond plane feature; removing the dielectric material to form an air gap between the conductive trace and the recessed surface; and bonding a second bond plane feature of a second substrate to the first bond plane feature of the first substrate.

In nineteenth examples for any of examples 18 wherein forming the first bond plane feature comprises forming the first bond plane feature coplanar with the conductive trace.

In twentieth examples for any of examples 18-19 wherein forming the first bond plane feature comprises forming one of a metal plane structure or a dielectric plane structure.

In twenty first examples for any of examples 18-20 wherein bonding the second bond plane feature to the first bond plane feature comprises forming one of a dielectric to dielectric bond or a metal to metal bond.

It will be recognized that principles of the disclosure are not limited to the embodiments so described but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An integrated circuit package structure, comprising:

a first glass core substrate comprising a first metal structure on a surface of the first substrate;

a second glass core substrate comprising a second metal structure on a surface of the second glass core substrate, wherein the first and second metal structures are in direct physical contact at a bonding interface therebetween;

a conductive trace on the surface of the first glass core substrate adjacent to the bonding interface and over a recessed surface of the first glass core substrate; and a first air gap between the conductive trace and the bonding interface and a second air gap between the conductive trace and the recessed surface of the first glass core substrate.

2. The integrated circuit package structure of claim 1, wherein the first glass core substrate comprises a build up layer thereon.

3. The integrated circuit package structure of claim 1, wherein a portion of the first air gap is between the first glass core substrate and the second glass core substrate.

4. The integrated circuit package structure of claim 1, wherein the first metal structure and the conductive trace comprise the same material.

5. The integrated circuit package structure of claim 4, wherein a third air gap is adjacent the second air gap.

6. The integrated circuit package structure of claim 5, wherein a pylon is between the second air gap and the third air gap.

7. The integrated circuit package structure of claim 6, wherein a portion of the conductive trace on the pylon comprises one of a narrowed width or a rectangular extension.

8. The integrated circuit package structure of claim 1, wherein the second glass core substrate comprises a third metal structure on a side opposite the second metal structure, wherein the third metal structure is in direct physical contact with a fourth metal structure on a surface of a third glass core substrate, and wherein a third air gap is between the fourth metal structure and a conductive trace on the surface of the third glass core substrate.

9. The integrated circuit package structure of claim 1, wherein a through glass via extends through the first glass core substrate.

10. The integrated circuit package structure of claim 1, wherein the first metal structure and the conductive trace comprise substantially the same thickness.

11. An integrated circuit (IC) package structure, comprising:

a first glass core substrate comprising a first plane structure on a surface of the first glass core substrate;

a second glass core substrate comprising a second plane structure on a surface of the second glass core substrate, wherein the first and second plane structures are in direct physical contact with each other;

a conductive trace on the surface of the first glass core substrate adjacent to the first plane structure;

an air gap between the conductive trace and a bond interface between the first and second plane structures;

an integrated circuit die coupled to at least one of the first glass core substrate or the second glass core substrate; and a power supply coupled to IC package to provide power to the integrated circuit die.

12. The package structure of claim 11, wherein the first and second plane structures comprise a dielectric material or a conductive material.

13. The package structure of claim 12, wherein the conductive material comprises copper or a copper alloy.

14. The package structure of claim 12, wherein the dielectric material comprises one or more of silicon, nitrogen, or oxygen.

15. The package structure of claim 11, wherein the first and second plane structures comprise a combined height of between 1 micron and 100 microns.

16. The package structure of claim 11, wherein a height of the air gap is between 1 micron to 30 microns.

17. The package structure of claim 11 wherein the conductive trace is substantially coplanar with the bond interface.

* * * * *